US012685218B2

(12) United States Patent
Arrington et al.

(10) Patent No.: US 12,685,218 B2
(45) Date of Patent: Jul. 14, 2026

(54) METAL PCB FOR TOPSIDE POWER DELIVERY

(71) Applicant: Intel Corporation, Santa Clara, CA (US)

(72) Inventors: Kyle Arrington, Gilbert, AZ (US); Kuang Liu, Queen Creek, AZ (US); Bohan Shan, Chandler, AZ (US); Hongxia Feng, Chandler, AZ (US); Don Douglas Josephson, Fort Collins, CO (US); Stephen Morein, San Jose, CA (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 17/710,753

(22) Filed: Mar. 31, 2022

(65) Prior Publication Data

US 2023/0317706 A1     Oct. 5, 2023

(51) Int. Cl.
H10W 90/00     (2026.01)
H10W 40/25     (2026.01)
H10W 70/02     (2026.01)
H10W 70/60     (2026.01)
H10W 72/90     (2026.01)
(Continued)

(52) U.S. Cl.
CPC ......... H10W 90/00 (2026.01); H10W 40/258 (2026.01); H10W 70/02 (2026.01); H10W 70/60 (2026.01); H10W 70/611 (2026.01); H10W 72/926 (2026.01); H10W 72/07352 (2026.01); H10W 72/07653 (2026.01); H10W

*72/327* (2026.01); *H10W 72/646* (2026.01); *H10W 72/652* (2026.01); *H10W 72/931* (2026.01);
(Continued)

(58) Field of Classification Search
CPC . H01L 25/18; H01L 25/0652; H01L 21/4871; H01L 23/3736; H01L 23/538; H01L 24/40; H10W 90/00; H10W 40/258; H10W 70/02
USPC ........................................... 361/704
See application file for complete search history.

(56) References Cited

U.S. PATENT DOCUMENTS

| 2007/0120149 A1* | 5/2007 | Frutschy | ........... H01L 23/49805 257/E23.079 |
| 2008/0155990 A1* | 7/2008 | Gupta | ...................... G06F 1/20 62/3.2 |

(Continued)

FOREIGN PATENT DOCUMENTS

| EP | 4156263 A2 | 3/2023 |
| WO | WO 2023/115450 | 6/2023 |

OTHER PUBLICATIONS

Search Report from European Patent Application No. 23156628.2, mailed Aug. 11, 2023, 7 pgs.

*Primary Examiner* — Zhengfu J Feng
(74) *Attorney, Agent, or Firm* — Schwabe, Williamson & Wyatt, P.C.

(57)     ABSTRACT

Embodiments disclosed herein include electronic packages and methods of forming such electronic packages. In an embodiment, an electronic package comprises a package substrate, and a die on the package substrate. In an embodiment, the electronic package further comprises a voltage regulator on the package substrate adjacent to the die, and a metal printed circuit board (PCB) heat spreader. In an
(Continued)

embodiment, a trace on the metal PCB heat spreader couples the die to the voltage regulator.

20 Claims, 15 Drawing Sheets

(51) Int. Cl.

| | | |
|---|---|---|
| *H10W 72/00* | (2026.01) | |
| *H10W 72/30* | (2026.01) | |
| *H10W 72/60* | (2026.01) | |

(52) U.S. Cl.
CPC ........ *H10W 72/952* (2026.01); *H10W 90/724* (2026.01); *H10W 90/736* (2026.01)

(56) References Cited

U.S. PATENT DOCUMENTS

| | | | | |
|---|---|---|---|---|
| 2009/0289354 | A1 | 11/2009 | Landau | |
| 2011/0272179 | A1* | 11/2011 | Vasoya ................ | H05K 1/0204 |
| | | | | 29/846 |
| 2014/0293554 | A1* | 10/2014 | Shashkov ................ | H05K 1/18 |
| | | | | 428/209 |
| 2019/0333876 | A1* | 10/2019 | Yudanov ................. | H01L 25/16 |
| 2021/0035886 | A1* | 2/2021 | Islam ................. | H05K 7/20445 |
| 2021/0398895 | A1 | 12/2021 | Elsherbini | |

\* cited by examiner

METAL PCB FOR TOPSIDE POWER DELIVERY

TECHNICAL FIELD

Embodiments of the present disclosure relate to electronic packages, and more particularly to electronic packages with a top side PCB with a metal core.

BACKGROUND

Advances in silicon processes may lead to packaging that includes routing and interconnects to the top side of the silicon die. While there are numerous methods of interconnectors, most present the problem of either poor thermal/electrical performance, high cost, and/or manufacturing challenges. Typical organic substrates have excellent electrical performances, but provide very poor thermal performance due to their low thermal conductivities and large thicknesses. Other methods, such as electroplating and layer fabrication on package, require expensive investments and require overcoming complex thermal mechanical assembly problems.

EMBODIMENTS OF THE PRESENT DISCLOSURE

Figures 1A, 1B:
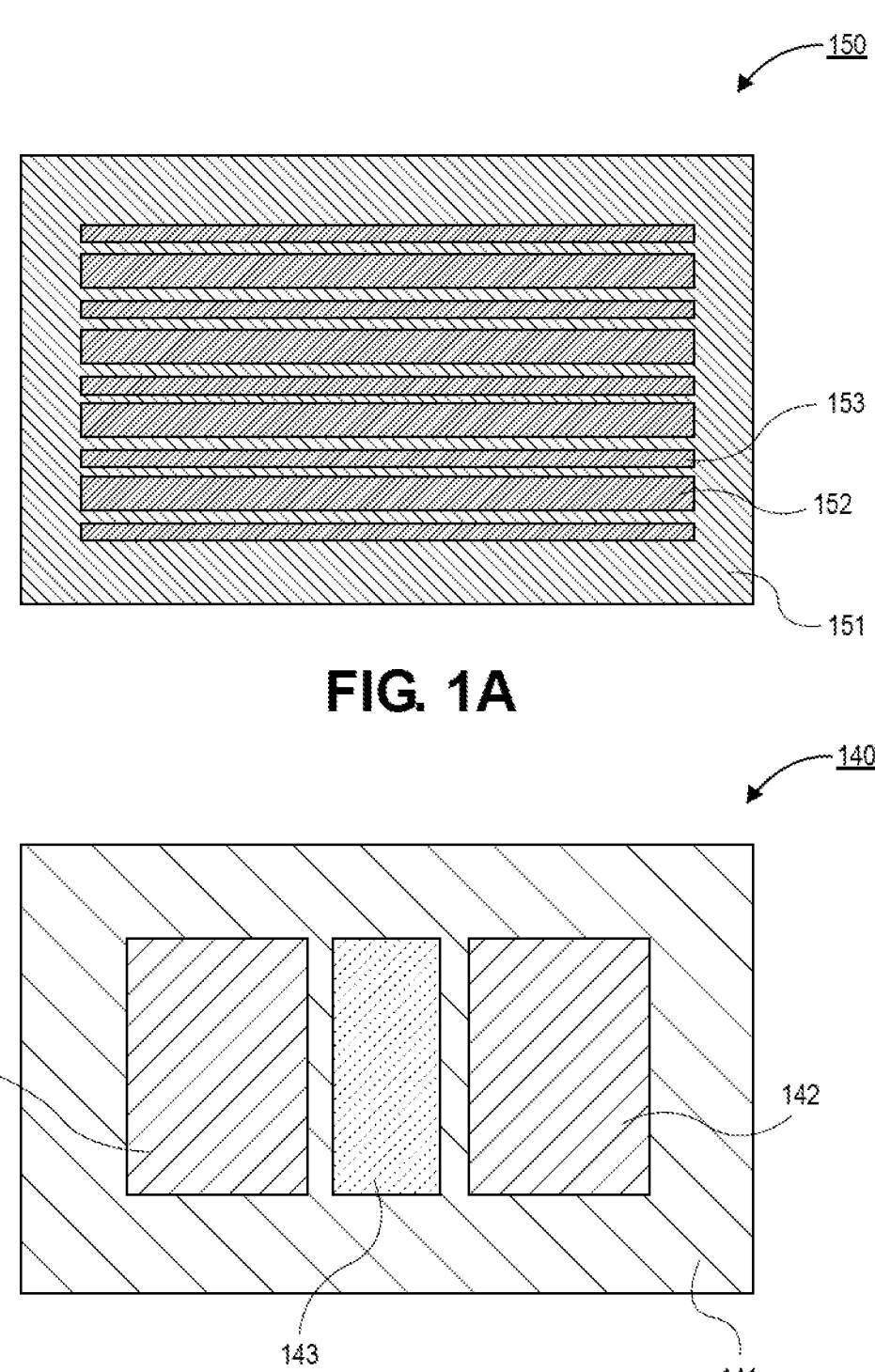
FIG. 1A is a plan view illustration of a metal printed circuit board (PCB) heat spreader, in accordance with an embodiment.
FIG. 1B is a plan view illustration of an electronic package, in accordance with an embodiment.

Described herein are electronic packages with a top side PCB with a metal core, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing interconnect methods to connect to the top side of a die are limited. Particularly, such solutions result in either poor thermal/electrical performance, have a high cost, or include manufacturing challenges. Accordingly, embodiments disclosed herein manage to overcome complex thermal mechanical assembly issues. For example, embodiments disclosed herein enable good thermal/electrical performance, while managing to keep costs low.

In an embodiment, a metallic printed circuit board (PCB) heat spreader is used to build up copper traces that will be used to route signals on the top side of the package. As an example, embodiments allow the potential to route power from the package voltage regulators (VRs) to the top of a die or stacked die complex. A metallic PCB (e.g., copper, aluminum, or any other metal) will be developed to have the desired copper traces. This PCB will utilize a thick metallic base (e.g., 5.0 mm thick or smaller), that will also be used as the integrated heat spreader (IHS) for the package.

In an embodiment, on the substrate side VRs are mounted to the substrate and will be provided between dies or die complexes (e.g., stacked die embodiments). Either one or multiple die complexes can be powered by a central VR block. The final assembly may use solder to bond the metal PCB heat spreader to the die(s) and the VR blocks. The solder may act as a first thermal interface material (TIM1) to help route the heat from the die(s) and VR block to the thick metal base that will spread the heat. A second thermal interface material (TIM2) may then transfer heat from the metal PCB heat spreader to an IHS or heat sink. The gaps between traces may be filled with a non-electrically conductive filled polymer system or the like.

Referring now to FIG. 1A, a plan view illustration of a metal PCB heat spreader 150 is shown, in accordance with an embodiment. In an embodiment, the metal PCB heat spreader 150 may comprise a metal base 151. For example, the metal base 151 may include copper, aluminum, or any other metal. The metal base 151 may have a thickness that is up to approximately 5.0 mm. In a particular embodiment, the thickness of the metal base 151 may be between approximately 0.3 mm and approximately 3.0 mm. As used herein, "approximately" may refer to a value that is within ten percent of the stated value. For example, approximately 5.0 mm may refer to a range between 4.5 mm and 5.5 mm. In an embodiment, the metal base 151 may have a bare surface, as shown. In other embodiments, a dielectric layer (not shown) may be provide over the metal base 151. The dielectric layer may be a thin layer (e.g., 1 µm or thinner).

In an embodiment, traces 153 and 152 may be provided over the metal base 151. The traces 153 and 152 may be copper traces, or the like. The traces 153 and 152 may be fabricated with traditional plating processes for semiconductor packaging applications, as will be described in greater detail below. In an embodiment, the traces 153 and 152 may be formed directly on the metal base 151. In other embodiments, one or both of the traces 153 and 152 may be separated from the metal base 151 by a dielectric layer, as described above. In an embodiment, the traces 153 and 152 may be used to provide top side connections to features on the underlying package substrate. For example, one or more dies may be coupled to VRs by the traces 153 and 152. In the illustrated embodiment, the traces 153 and 152 are a plurality of parallel lines. In other embodiments, the traces 153 and 152 may have any shape in order to provide the necessary routing between components on the package substrate.

Referring now to FIG. 1B, a plan view illustration of the electronic package 140 is shown, in accordance with an embodiment. In an embodiment, the electronic package 140 may comprise a package substrate 141. The package substrate 141 may include conductive routing and other electrical features (not shown). The package substrate 141 may comprise a plurality of laminated dielectric layers with the conductive routing between the dielectric layers. In some embodiments, the package substrate 141 may include a core, though coreless embodiments may also be used.

In an embodiment, a pair of dies 142 are illustrated on the package substrate 141. The dies 142 may be single dies. In other embodiments, the dies 142 may be the top dies of a stack of dies. That is, additional dies may be provided below the pair of dies 142 in some embodiments. In an embodiment, a VR block 143 may also be provided on the package substrate 141. The VR block 143 may be provided between the pair of dies 142. As such, the traces 153 and 152 described above can be used to connect the top of the dies 142 to the VR block 143.

Figure 1C:
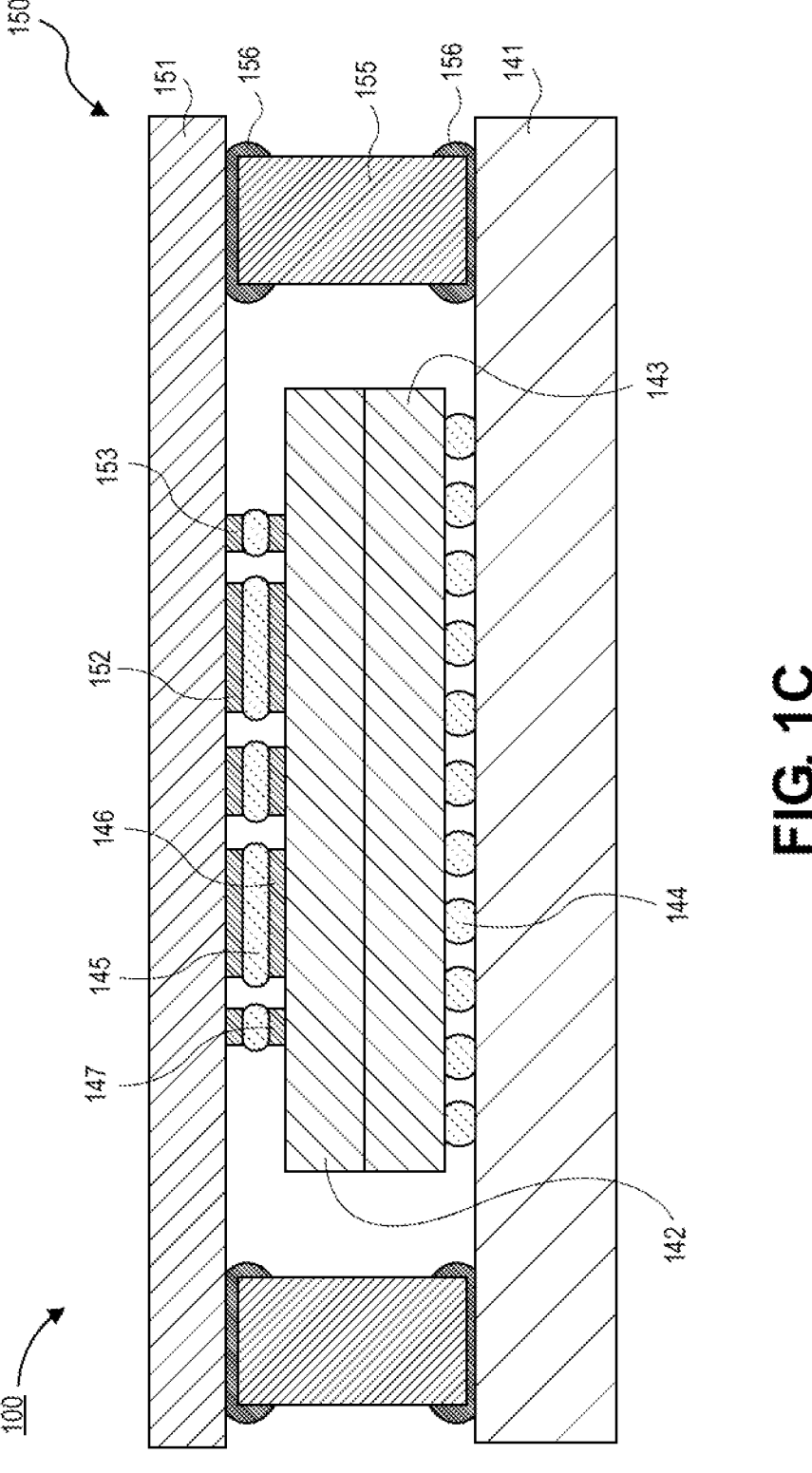
FIG. 1C is a cross-sectional illustration of the metal PCB attached to the electronic package, in accordance with an embodiment.

Referring now to FIG. 1C, a cross-sectional illustration of an electronic system 100 is shown, in accordance with an embodiment. In an embodiment, the electronic system 100 may include a package substrate 141. The package substrate 141 in FIG. 1C may be substantially similar to the package substrate 141 described above with respect to FIG. 1B. In an embodiment, a stack of dies 142 and 143 are coupled to the package substrate 141 by solder balls 144 or other interconnect architectures. In the illustrated embodiment, two dies 142 and 143 are provided in the stack of dies. However, it is to be appreciated that one or more dies may be included in the stack.

In an embodiment, the metal PCB heat spreader 150 may be connected to the top surface of the die 142. For example, the metal PCB heat spreader 150 may include a metal base 151 and traces 152 and 153. The metal base 151 and the traces 152 and 153 may be substantially similar to the metal base 151 and traces 152 and 153 described in greater detail above. The traces 152 and 153 may be coupled to pads 146 and 147 by solder 145 or the like. In an embodiment, the edges of the metal base 151 may be supported by a stiffener 155. The stiffener 155 may be coupled between the metal base 151 and the package substrate 141. Sealant 156 or other adhesives may be used to secure the stiffener 155 to the metal base 151 and the package substrate 141. In an embodiment, the stiffener 155 is a stiff material (e.g., aluminum, etc.) that provides mechanical stiffness to the underlying package substrate 141 in order to reduce warpage or other deformation of the package substrate 141.

Figure 2:
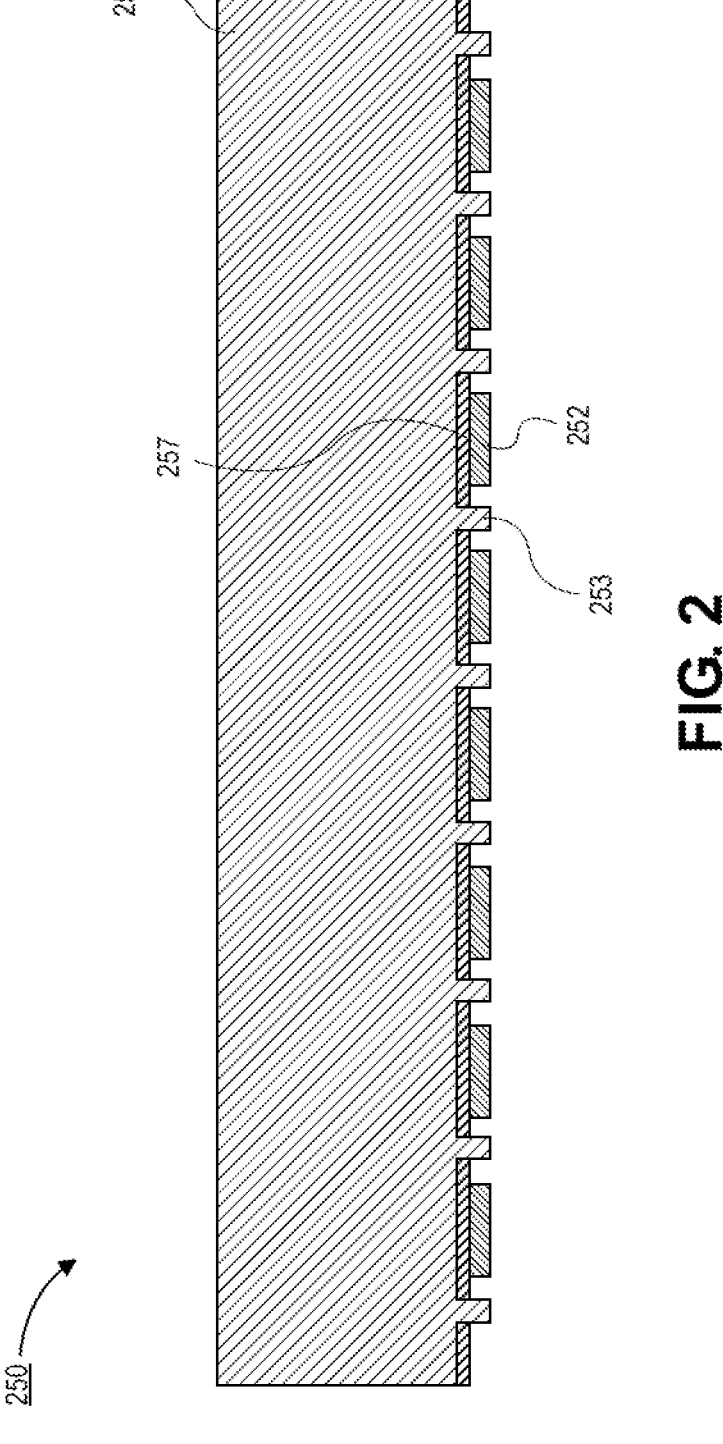
FIG. 2 is a cross-sectional illustration of a metal PCB heat spreader, in accordance with an embodiment.

Referring now to FIG. 2, a cross-sectional illustration of a metal PCB heat spreader 250 is shown, in accordance with an embodiment. In an embodiment, the metal PCB heat spreader 250 may include a metal base 251. The metal base 251 may be copper, aluminum, or any other suitable metal material. In an embodiment, the thickness of the metal base 251 may be between approximately 5.0 mm or smaller. Larger thicknesses provide more thermal mass to improve spreading of heat.

In an embodiment, a dielectric layer 257 may be provided over a bottom surface of the metal base 251. The dielectric layer 257 may be any suitable dielectric material. For example, the dielectric layer 257 may comprise silicon and nitrogen (e.g., silicon nitride). In an embodiment, a thickness of the dielectric layer 257 may be approximately 1 µm or less. Small thicknesses allow for improved removal of thermal energy from the underlying dies.

In an embodiment, the metal PCB heat spreader 250 may include first traces 252 and second traces 253. The first traces 252 may be provided over the dielectric layer 257. That is, the first traces 252 may be electrically isolated from the metal base 251. In an embodiment, the second traces 253 may pass through the dielectric layer 257. As such, the second traces 253 may be electrically coupled to the metal base 251. Such traces 253 may be suitable for grounded traces when the metal base 251 is held at ground potential. In the illustrated embodiment, the width of the first traces 252 is greater than the width of the second traces 253. However, it is to be appreciated that the widths of the first traces 252 and the second traces 253 may be any suitable width, and they do not have to have the same configuration shown in FIG. 2.

Referring now to FIGS. 3A-3E, a series of cross-sectional illustrations depicting electronic systems 300 that include various metal PCB heat spreader architectures is shown, in accordance with an embodiment. That is, the structure of the metal PCB heat spreader is flexible in order to accommodate various system architectures.

Figure 3A:
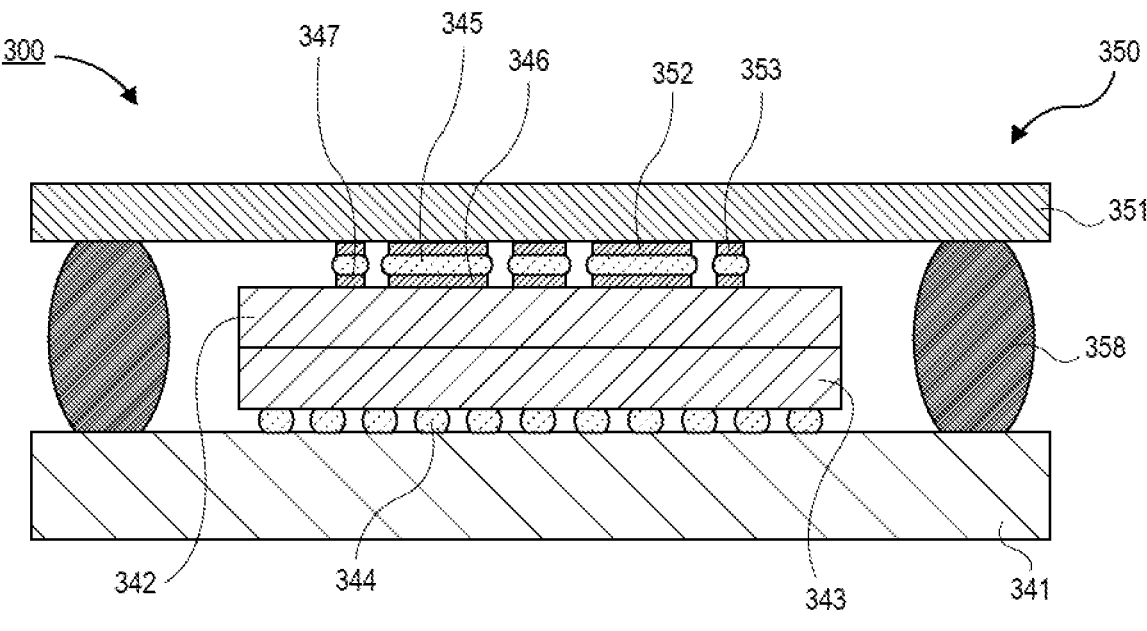
FIG. 3A is a cross-sectional illustration of an electronic package with a metal PCB heat spreader that is coupled to the package substrate by a sealant, in accordance with an embodiment.

Referring now to FIG. 3A, a cross-sectional illustration of an electronic system 300 is shown, in accordance with an embodiment. In an embodiment, the electronic system 300 may comprise a package substrate 341. One or more dies 342 and 343 may be coupled to the package substrate 341 by solder balls 344 or other interconnect architectures. In an embodiment, a metal PCB heat spreader 350 is coupled to the top die 342. The metal PCB heat spreader 350 may include a metal base 351. One or more first traces 352 and second traces 353 may be provided over the metal base 351. In an embodiment, the first traces 352 and the second traces 353 may be directly contacting the metal base 351, or one or both of the first traces 352 and the second traces 353 may be separated from the metal base 351 by a thin dielectric layer (not shown).

In an embodiment, the metal PCB heat spreader 350 may be coupled to the top die 342 by solder 345 or the like. For example, first pads 346 and second pads 347 on the top surface of the top die 342 may be connected to the first traces 352 and the second traces 353 by the solder 345. In an embodiment, the first traces 352 and the second traces 353 electrically couple the first pads 346 and the second pads 347 to pads on a different structure out of the plane of FIG. 3A. For example, the die 342 may be coupled to a VR block that is also provided on the package substrate (e.g., behind or in front of the dies 342 and 343).

In an embodiment, the outer edge of the metal base 351 may also be coupled to the package substrate 341. For example, a sealant 358 or the like may mechanically couple the metal base 351 to the package substrate 341. That is, in some embodiments, there might not be a stiffener between the metal base 351 and the package substrate 341, as is the case in the embodiment described above with respect to FIG. 1C.

Figure 3B:
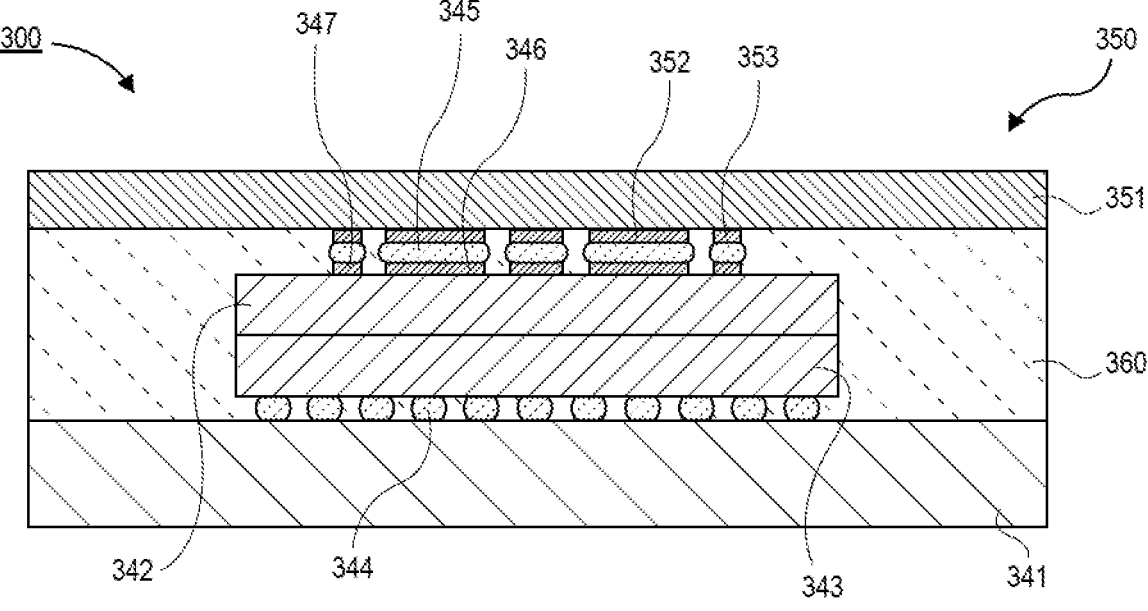
FIG. 3B is a cross-sectional illustration of an electronic package with a metal PCB heat spreader that is coupled to the package substrate by a mold layer, in accordance with an embodiment.

Referring now to FIG. 3B, a cross-sectional illustration of an electronic system 300 is shown, in accordance with an embodiment. In an embodiment, the electronic system 300 may comprise a package substrate 341. One or more dies 342 and 343 may be coupled to the package substrate 341 by solder balls 344 or other interconnect architectures. In an embodiment, a metal PCB heat spreader 350 is coupled to the top die 342. The metal PCB heat spreader 350 may include a metal base 351. One or more first traces 352 and second traces 353 may be provided over the metal base 351. In an embodiment, the first traces 352 and the second traces 353 may be directly contacting the metal base 351, or one or both of the first traces 352 and the second traces 353 may be separated from the metal base 351 by a thin dielectric layer (not shown).

In an embodiment, the metal PCB heat spreader 350 may be coupled to the top die 342 by solder 345 or the like. For example, first pads 346 and second pads 347 on the top surface of the top die 342 may be connected to the first traces 352 and the second traces 353 by the solder 345. In an embodiment, the first traces 352 and the second traces 353 electrically couple the first pads 346 and the second pads 347 to pads on a different structure out of the plane of FIG. 3B. For example, the die 342 may be coupled to a VR block that is also provided on the package substrate (e.g., behind or in front of the dies 342 and 343).

In an embodiment, the metal base 351 may be coupled to the package substrate 341 by a mold layer 360. In an embodiment, the mold layer 360 may be an epoxy or any other molding compound. In an embodiment, the mold layer 360 may also surround the solder 345 that connects the traces 352 and 353 to the pads 346 and 347.

Figure 3C:
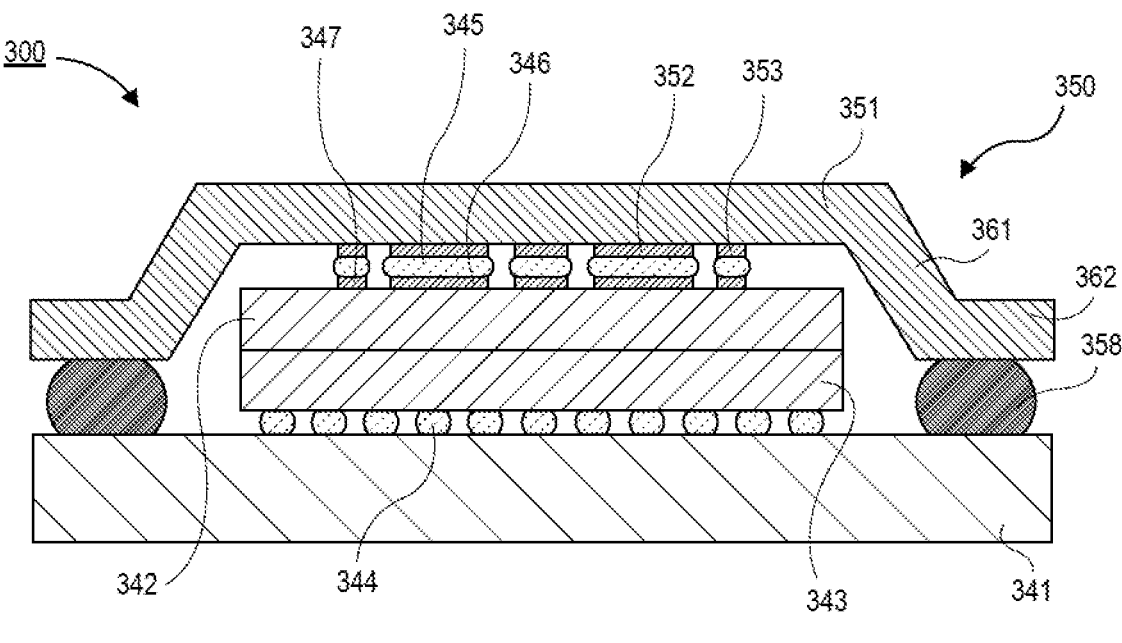
FIG. 3C is a cross-sectional illustration of an electronic package with a metal PCB heat spreader that includes legs that are attached to the package substrate, in accordance with an embodiment.

Referring now to FIG. 3C, a cross-sectional illustration of an electronic system 300 is shown, in accordance with an embodiment. In an embodiment, the electronic system 300 may comprise a package substrate 341. One or more dies 342 and 343 may be coupled to the package substrate 341 by solder balls 344 or other interconnect architectures. In an embodiment, a metal PCB heat spreader 350 is coupled to the top die 342. The metal PCB heat spreader 350 may include a metal base 351. One or more first traces 352 and second traces 353 may be provided over the metal base 351. In an embodiment, the first traces 352 and the second traces 353 may be directly contacting the metal base 351, or one or both of the first traces 352 and the second traces 353 may be separated from the metal base 351 by a thin dielectric layer (not shown).

In an embodiment, the metal PCB heat spreader 350 may be coupled to the top die 342 by solder 345 or the like. For example, first pads 346 and second pads 347 on the top surface of the top die 342 may be connected to the first traces 352 and the second traces 353 by the solder 345. In an embodiment, the first traces 352 and the second traces 353 electrically couple the first pads 346 and the second pads 347 to pads on a different structure out of the plane of FIG. 3C. For example, the die 342 may be coupled to a VR block that is also provided on the package substrate (e.g., behind or in front of the dies 342 and 343).

In an embodiment, the outer edge of the metal base 351 may include legs 361. The legs 361 extend down from the metal base 351 towards the package substrate 341. In the illustrated embodiment, the legs 361 are angled. Though, in other embodiments, the legs 361 may be substantially vertical. In an embodiment, footings 362 may be provided at the bottom of the legs 361. The footings 362 may be used to connect the metal PCB heat spreader 350 to the package substrate 341. For example, a sealant 358 or other adhesive may be used to mechanically couple the footings 362 to the package substrate 341.

Figure 3D:
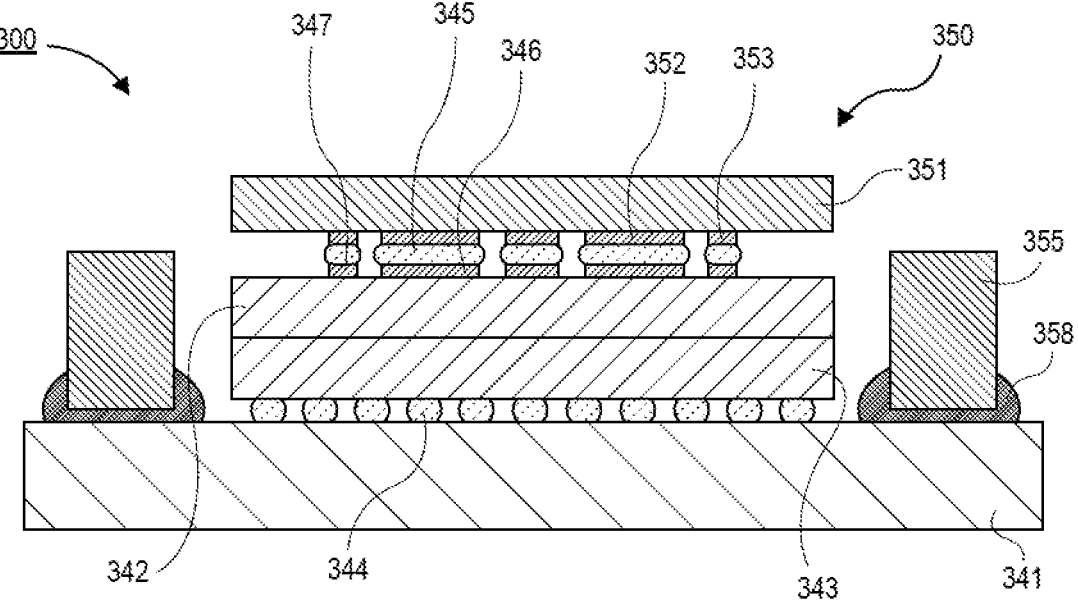
FIG. 3D is a cross-sectional illustration of an electronic package with a metal PCB heat spreader and a stiffener, in accordance with an embodiment.

Referring now to FIG. 3D, a cross-sectional illustration of an electronic system 300 is shown, in accordance with an embodiment. In an embodiment, the electronic system 300 may comprise a package substrate 341. One or more dies 342 and 343 may be coupled to the package substrate 341 by solder balls 344 or other interconnect architectures. In an embodiment, a metal PCB heat spreader 350 is coupled to the top die 342. The metal PCB heat spreader 350 may include a metal base 351. One or more first traces 352 and second traces 353 may be provided over the metal base 351. In an embodiment, the first traces 352 and the second traces 353 may be directly contacting the metal base 351, or one or both of the first traces 352 and the second traces 353 may be separated from the metal base 351 by a thin dielectric layer (not shown).

In an embodiment, the metal PCB heat spreader 350 may be coupled to the top die 342 by solder 345 or the like. For example, first pads 346 and second pads 347 on the top surface of the top die 342 may be connected to the first traces 352 and the second traces 353 by the solder 345. In an embodiment, the first traces 352 and the second traces 353 electrically couple the first pads 346 and the second pads 347 to pads on a different structure out of the plane of FIG. 3D. For example, the die 342 may be coupled to a VR block that is also provided on the package substrate (e.g., behind or in front of the dies 342 and 343).

In an embodiment, the outer edge of the metal base 351 may end so that the edge of the dies 342 and 343 are substantially coplanar with edges of the metal base 351. That is, the footprint of the metal base 351 may be substantially similar to the footprint of the dies 342 and 343. Though, it is to be appreciated that the footprint of the metal base 351 may be larger or smaller than a footprint of the dies 342 and 343. In such an embodiment, the metal base 351 may not be directly coupled to the package substrate 341. In some embodiments, a stiffener 355 may be provided around the dies 342 and 343. The stiffener 355 may be coupled to the package substrate by a sealant 358 or other adhesive. In an embodiment, the stiffener 355 is a rigid structure (e.g., aluminum, stainless steel, or other metal) that provides mechanical rigidity to the underlying package substrate 341 in order to minimize warpage or other mechanical deformation.

Figure 3E:
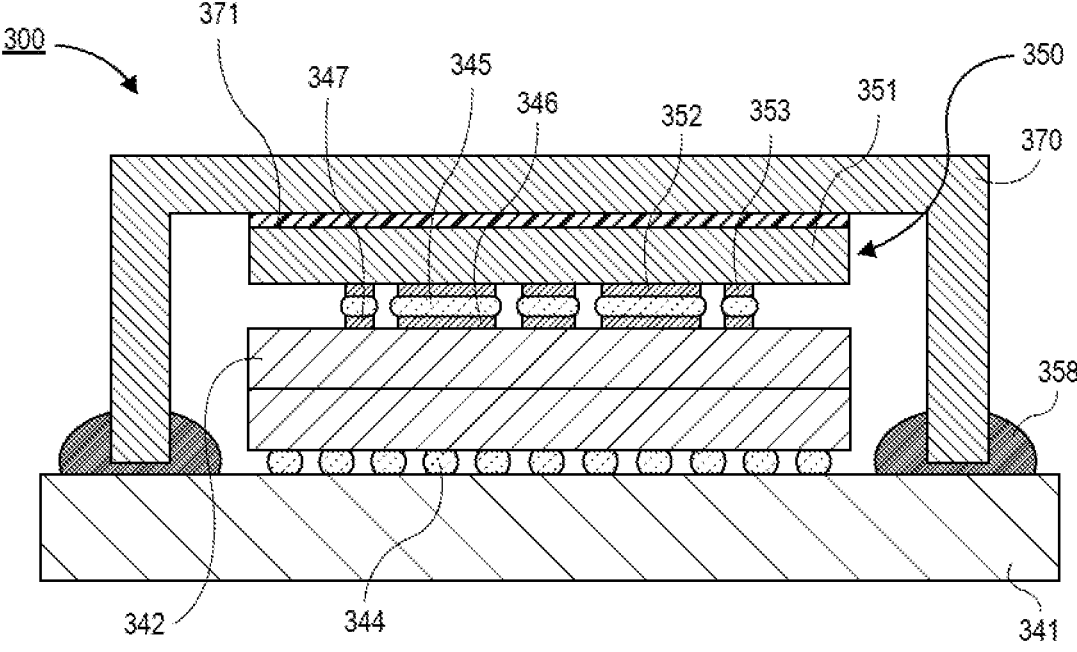
FIG. 3E is a cross-sectional illustration of an electronic package with a metal PCB heat spreader and an integrated heat spreader (IHS), in accordance with an embodiment.

Referring now to FIG. 3E, a cross-sectional illustration of an electronic system 300 is shown, in accordance with an embodiment. In an embodiment, the electronic system 300 may comprise a package substrate 341. One or more dies 342 and 343 may be coupled to the package substrate 341 by solder balls 344 or other interconnect architectures. In an embodiment, a metal PCB heat spreader 350 is coupled to the top die 342. The metal PCB heat spreader 350 may include a metal base 351. One or more first traces 352 and second traces 353 may be provided over the metal base 351. In an embodiment, the first traces 352 and the second traces 353 may be directly contacting the metal base 351, or one or both of the first traces 352 and the second traces 353 may be separated from the metal base 351 by a thin dielectric layer (not shown).

In an embodiment, the metal PCB heat spreader 350 may be coupled to the top die 342 by solder 345 or the like. For example, first pads 346 and second pads 347 on the top surface of the top die 342 may be connected to the first traces 352 and the second traces 353 by the solder 345. In an embodiment, the first traces 352 and the second traces 353 electrically couple the first pads 346 and the second pads 347 to pads on a different structure out of the plane of FIG. 3E. For example, the die 342 may be coupled to a VR block that is also provided on the package substrate (e.g., behind or in front of the dies 342 and 343).

In an embodiment, an IHS 370 may be provided over the metal base 351. The IHS 370 may be thermally coupled to the metal base 351 by a TIM 371. In an embodiment, the IHS 370 extends laterally past the edges of the metal baser 351. Legs may extend down from the top of the IHS 370 in order to couple with the package substrate 341. In an embodiment, a sealant 358 or other adhesive may be used to mechanically couple the IHS 370 to the package substrate 341.

Figure 4A:
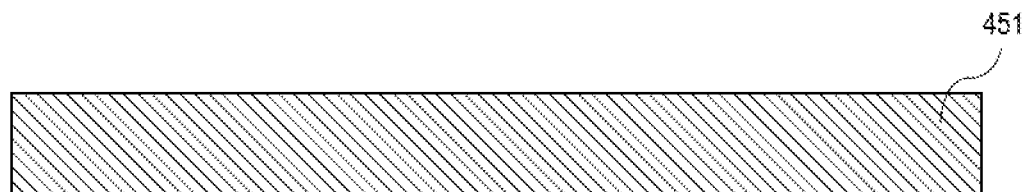
FIGS. 4A-4T are cross-sectional illustrations depicting a process for forming a metal PCB heat spreader, in accordance with an embodiment.
Figure 4B:
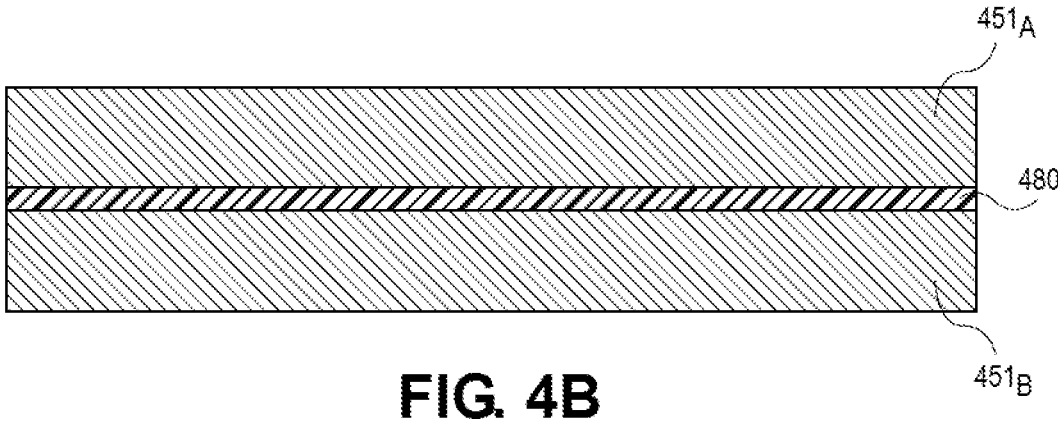
Figure 4C:
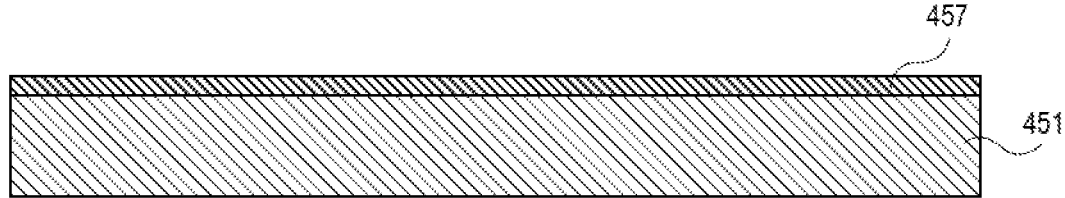
Figure 4D:
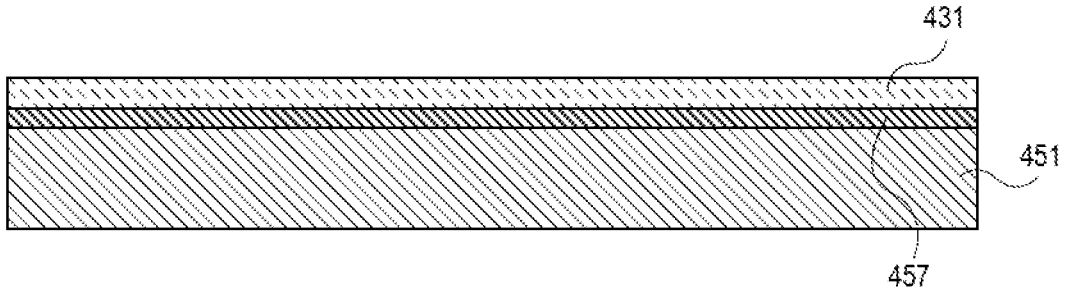
Figure 4E:
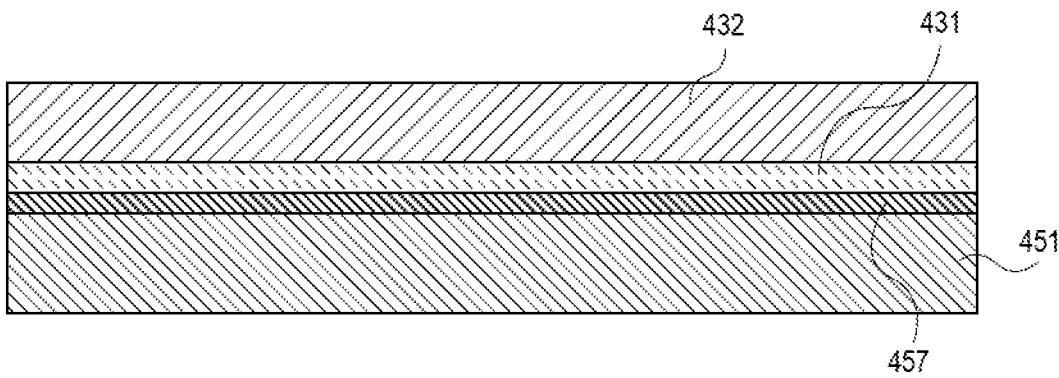
Figure 4F:
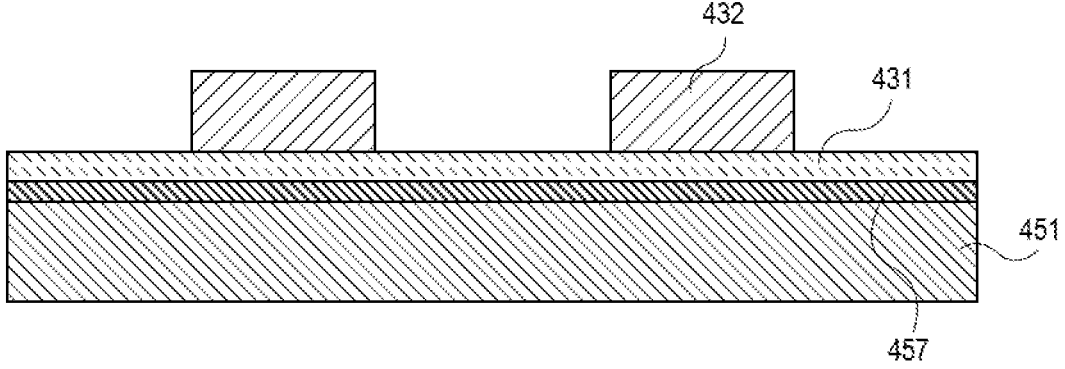
Figure 4G:
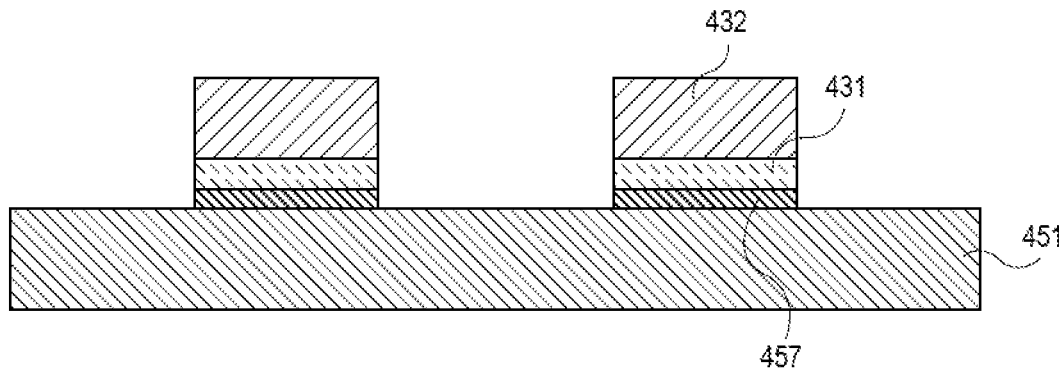
Figure 4H:
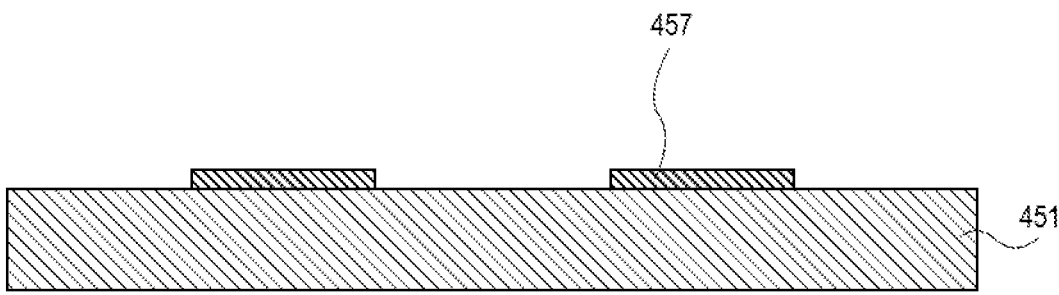
Figure 4I:
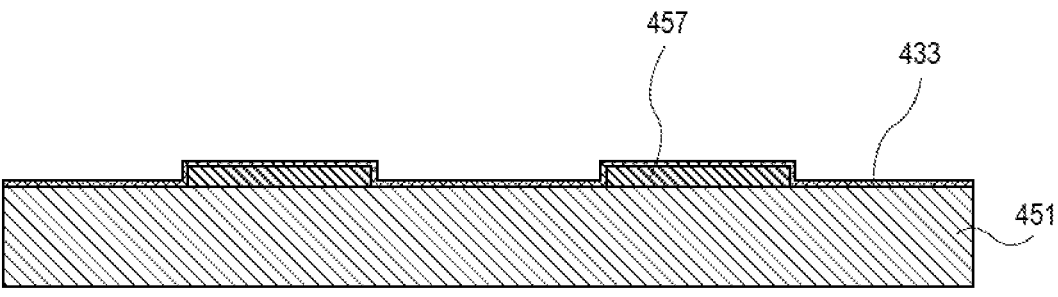
Figure 4J:
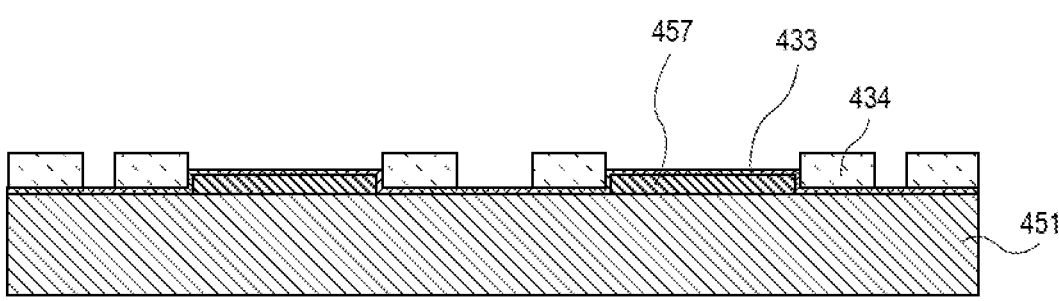
Figure 4K:
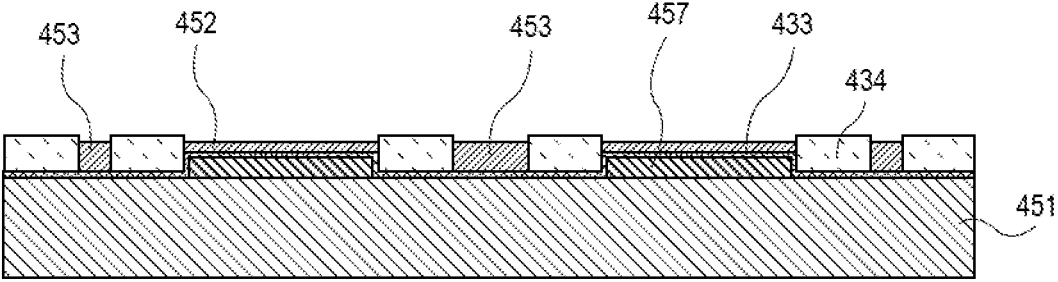
Figure 4L:
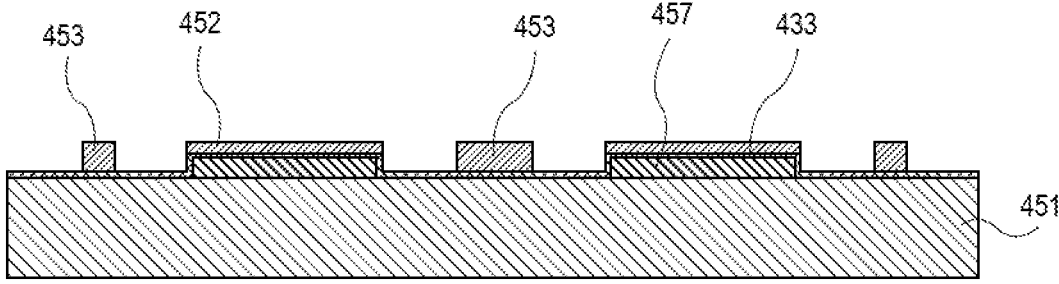
Figure 4M:
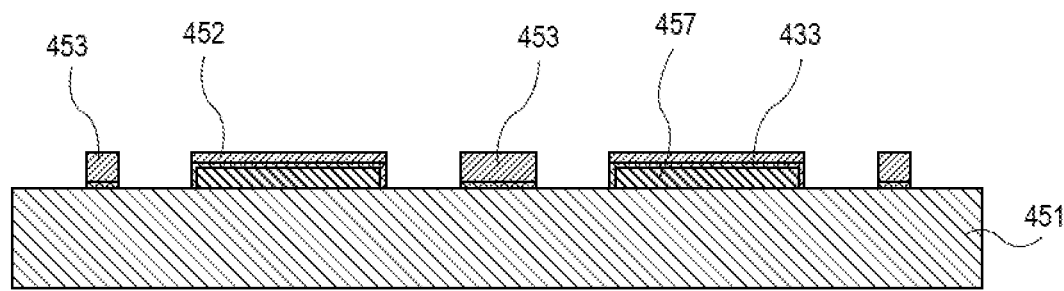
Figure 4N:
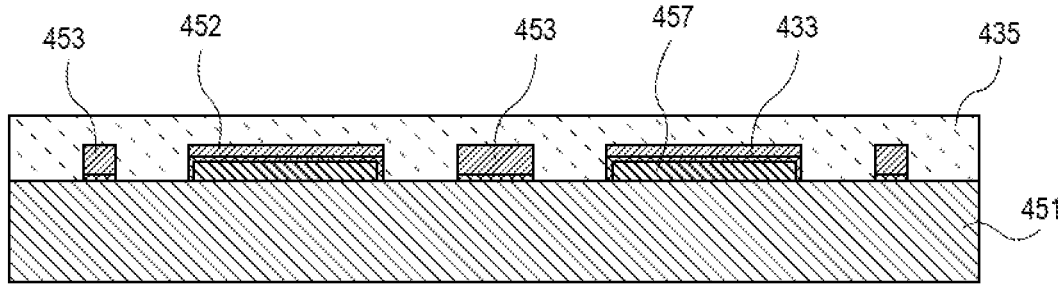
Figure 4O:
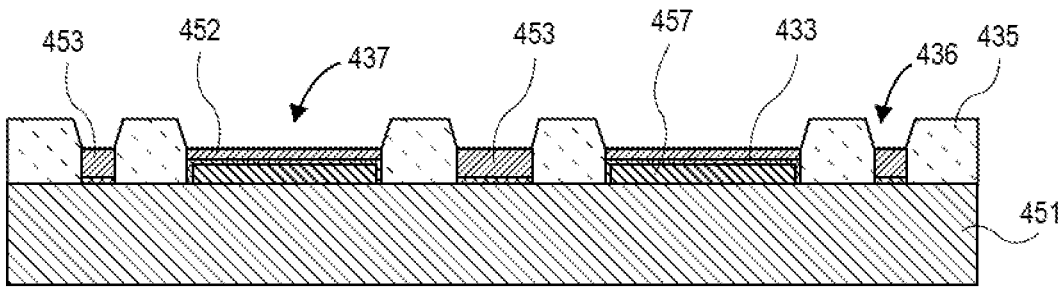
Figure 4P:
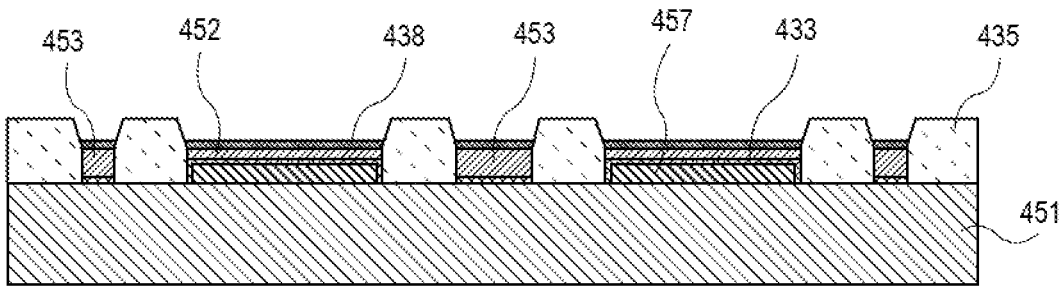
Figure 4Q:
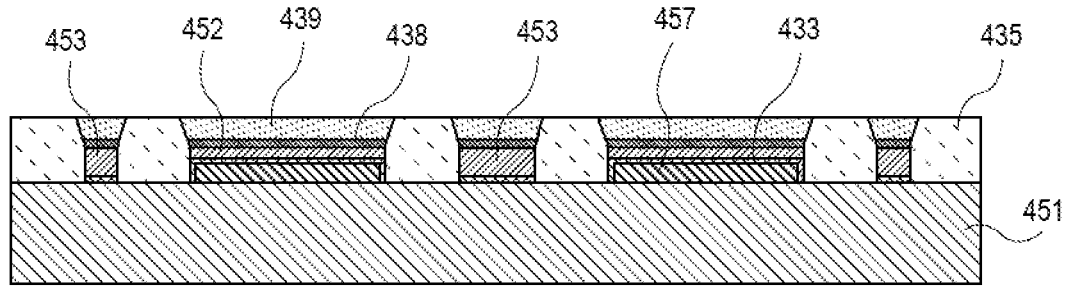
Figure 4R:
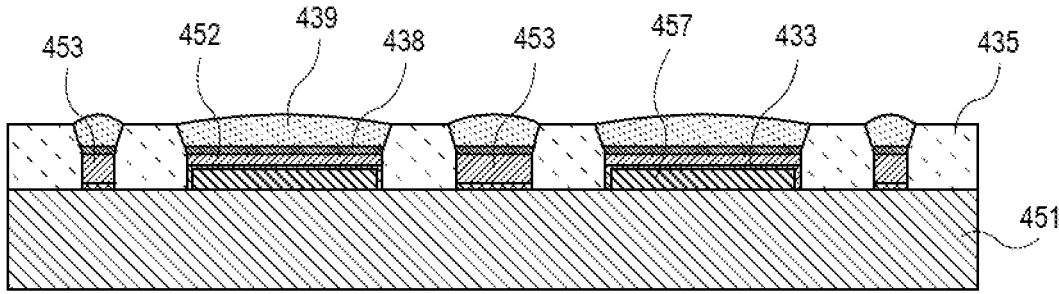
Figure 4S:
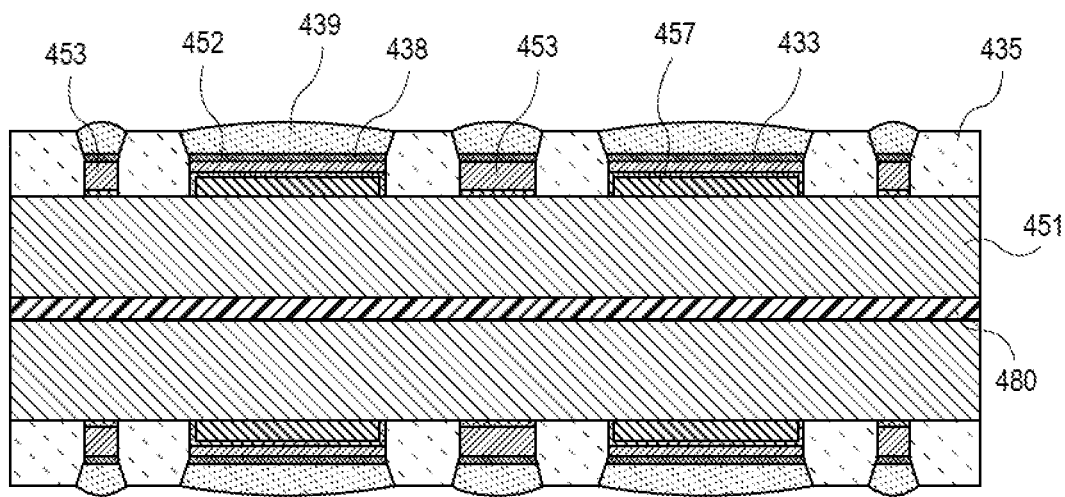
Figure 4T:
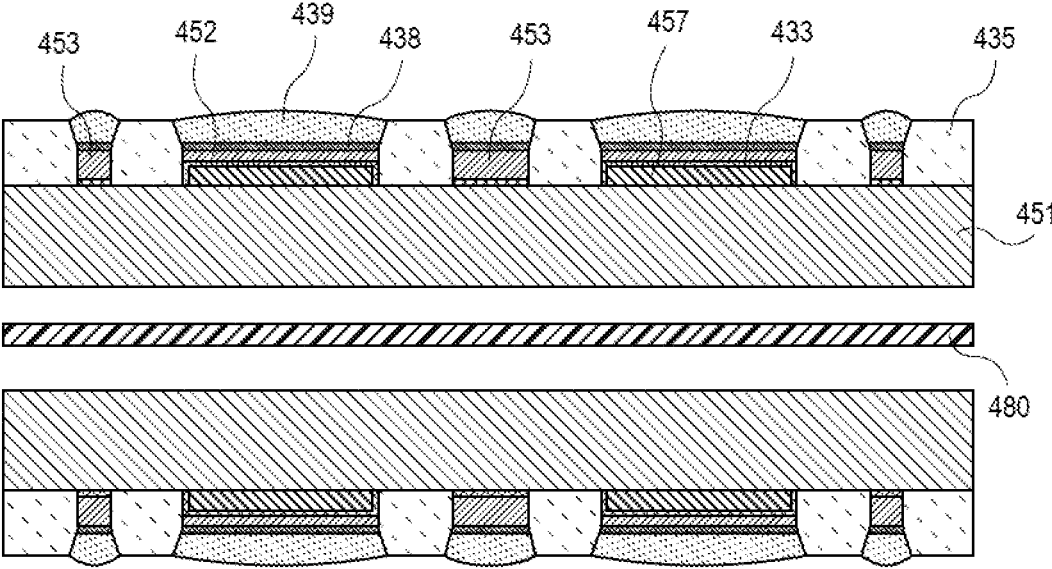

Referring now to FIGS. 4A-4T, a series of cross-sectional illustrations depicting a process for forming a metal PCB heat spreader is shown, in accordance with an embodiment.

Referring now to FIG. 4A, a cross-sectional illustration of a metal base 451 is shown, in accordance with an embodiment. In an embodiment, the metal base 451 may include copper, aluminum, or any other suitable metal material. The metal base 451 may have a thickness that is approximately 5.0 mm or less. In a particular embodiment, the thickness of the metal base 451 is between approximately 0.3 mm and approximately 3.0 mm.

Referring now to FIG. 4B, a cross-sectional illustration of a pair of metal bases 451A and 451E are shown. The metal bases 451A and 451E may be temporarily adhered to each other by a temporary adhesive 480. Such an architecture allows for the fabrication of two metal PCB heat spreaders substantially in parallel. That is, operations to the top metal base 451A may also be implemented on the bottom metal base 451B. For simplicity and ease of illustration, only the top metal base 451A is shown until the end, where both sides are again illustrated.

Referring now to FIG. 4C, a cross-sectional illustration of the metal base 451 after a dielectric layer 457 is formed over the metal base 451 is shown, in accordance with an embodiment. In an embodiment, the dielectric layer 457 may be a thin layer. For example, the dielectric layer 457 may have a thickness of approximately 1 μm or smaller. In an embodiment, the dielectric layer 457 may comprise silicon and nitrogen (e.g., silicon nitride) or any other suitable dielectric material.

Referring now to FIG. 4D, a cross-sectional illustration of the metal base 451 after an adhesion layer 431 is disposed over the dielectric layer 457. In an embodiment, the adhesion layer 431 may include HMDS or the like. Such an adhesion layer improves the adhesion of a subsequently added liquid photoresist material.

Referring now to FIG. 4E, a cross-sectional illustration of the metal base 451 after a photoresist layer 432 is disposed over the adhesion layer 431. In an embodiment, the photoresist layer 432 may be disposed with a spin coating process or any other suitable deposition process.

Referring now to FIG. 4F, a cross-sectional illustration of the metal base 451 after the photoresist layer 432 is patterned is shown, in accordance with an embodiment. In an embodiment, the patterning process may include an exposure of the photoresist and a developing process. As such, a soft mask structure is provided for subsequent patterning of the dielectric layer 457.

Referring now to FIG. 4G, a cross-sectional illustration of the metal base 451 after the patterning of the dielectric layer 457 is shown, in accordance with an embodiment. In an embodiment, the patterning process may be an etching process, such as with a wet etching chemistry. The patterning of the dielectric layer 457 re-exposes portions of the metal base 451.

Referring now to FIG. 4H, a cross-sectional illustration of the metal base 451 after the patterning layers are removed is shown, in accordance with an embodiment. In an embodiment, the patterning layers may be removed with a stripping process or the like.

Referring now to FIG. 4I, a cross-sectional illustration of the metal base 451 after a seed layer 433 is formed over the top surfaces is shown, in accordance with an embodiment. In an embodiment, the seed layer 433 may be a titanium or copper seed layer. The seed layer 433 may be formed with a deposition process, such as a chemical or physical vapor deposition process. An electroless process may also be used to form the seed layer 433.

Referring now to FIG. 4J, a cross-sectional illustration of the metal base 451 after a dry film resist (DFR) 434 is disposed over the top surfaces and patterned is shown, in accordance with an embodiment. In an embodiment, the DFR 434 may be patterned to form openings over the dielectric layer 457 and over regions without the dielectric layer 457.

Referring now to FIG. 4K, a cross-sectional illustration of the metal base 451 after traces 452 and 453 are formed is shown, in accordance with an embodiment. As shown, the traces 452 are over the dielectric layer 457, and the traces 453 are provided over the metal base 451 without the dielectric layer 457 between them. The traces 452 and the traces 453 may be formed with an electrolytic plating process or the like.

Referring now to FIG. 4L, a cross-sectional illustration of the metal base 451 after the DFR 434 is removed is shown, in accordance with an embodiment. In an embodiment, the DFR 434 may be removed with a stripping process or the like.

Referring now to FIG. 4M, a cross-sectional illustration of the metal base 451 after the seed layer 433 is stripped is shown, in accordance with an embodiment. In an embodiment, the exposed portions of the seed layer 433 may be removed with an etching process or the like. It is to be appreciated that portions of the seed layer 433 may persist below the traces 452 and 453 in some embodiments.

Referring now to FIG. 4N, a cross-sectional illustration of the metal base 451 after a thermally conductive polymer 435 is disposed over the top surface is shown, in accordance with an embodiment. In an embodiment, the thermally conductive polymer 435 may include filler particles that improve the thermal conductivity, without being conductive in order to prevent the traces 452 and 452 from shorting together. For example, the filler particles may comprise BN, AlN, $Al_2O_3$, or the like.

Referring now to FIG. 4O, a cross-sectional illustration of the metal base 451 after openings 437 and 436 are provided into the thermally conductive polymer 435 is shown, in accordance with an embodiment. In an embodiment, the openings 437 and 436 may be formed with a laser drilling process. Sidewalls of the openings 437 and 436 may be tapered, as shown in FIG. 4O.

Referring now to FIG. 4P, a cross-sectional illustration of the metal base 451 after surface finishes 438 are applied over the traces 452 and 453 is shown, in accordance with an embodiment. In an embodiment, the surface finishes 438 may comprise nickel or any other suitable surface finish material.

Referring now to FIG. 4Q, a cross-sectional illustration of the metal base 451 after a solder 439 is disposed in the openings 437 and 436 is shown, in accordance with an embodiment. In an embodiment, the solder 439 may be disposed with a paste printing operation or any other suitable solder deposition process. In a particular embodiment, the solder 439 may be an InAg solder paste.

Referring now to FIG. 4R, a cross-sectional illustration of the metal base 451 after the solder 439 is reflown is shown, in accordance with an embodiment. The reflowing process may result in the formation of solder bumps, which can be used to couple the metal base 451 to pads on underlying dies as described in greater detail above.

Referring now to FIG. 4S, a cross-sectional illustration of the metal base 451 with both the topside metal base and the bottom side metal base 451 that are attached by the adhesive 480 is shown, in accordance with an embodiment. As noted above the top side structure and the bottom side structure may be substantially similar to each other.

Referring now to FIG. 4T, a cross-sectional illustration of the structure after the topside and the bottom side are separated from each other is shown, in accordance with an embodiment. For example, the adhesive 480 may be deactivated (e.g., with heat or the like). In other embodiments, the topside and the bottom side structures may be peeled off of the adhesive. In an embodiment, after splitting the topside and bottom side structures, the top and bottom structures may be singulated into individual units. Only a single unit is shown in FIGS. 4A-4T, but it is to be appreciated that multiple iterations of the metal PCB heat spreader may be formed on each of the topside and the bottom side.

Figure 5:
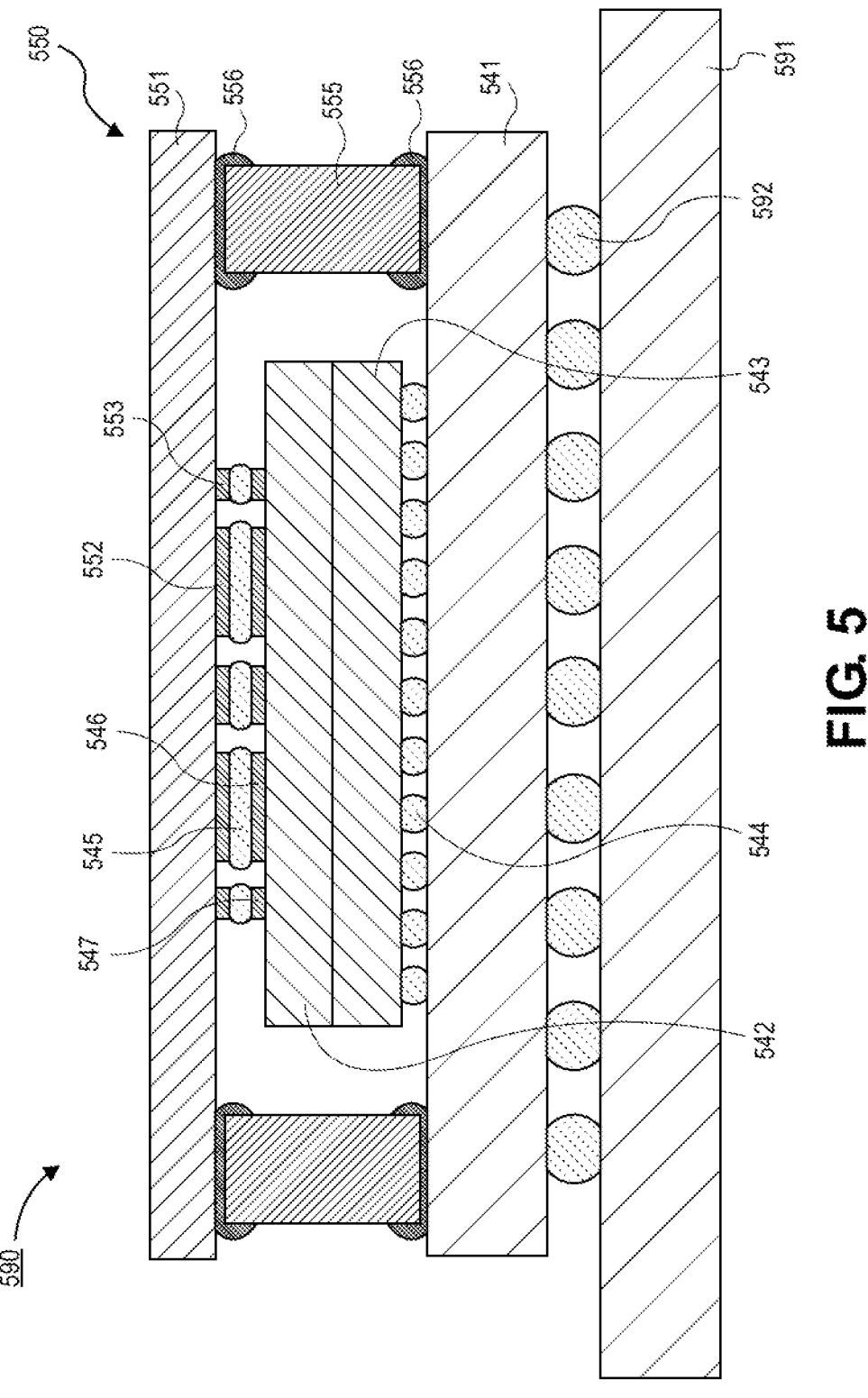
FIG. 5 is a cross-sectional illustration of an electronic system with a metal PCB heat spreader, in accordance with an embodiment.

Referring now to FIG. 5, a cross-sectional illustration of an electronic system 590 is shown, in accordance with an embodiment. In an embodiment, the electronic system 590 may include a package substrate 541. In an embodiment, a stack of dies 542 and 543 are coupled to the package substrate 541 by solder balls 544 or other interconnect architectures. In the illustrated embodiment, two dies 542 and 543 are provided in the stack of dies. However, it is to be appreciated that one or more dies may be included in the stack.

In an embodiment, the metal PCB heat spreader 550 may be connected to the top surface of the die 542. For example, the metal PCB heat spreader 550 may include a metal base 551 and traces 552 and 553. The traces 552 and 553 may be coupled to pads 546 and 547 by solder 545 or the like. In an embodiment, the edges of the metal base 551 may be supported by a stiffener 555. The stiffener 555 may be coupled between the metal base 551 and the package substrate 541. Sealant 556 or other adhesives may be used to secure the stiffener 555 to the metal base 551 and the package substrate 541. In a particular embodiment, the sealant 566 may comprise silicone, urethane, epoxy, or the like. In an embodiment, the stiffener 555 is a stiff material (e.g., aluminum, etc.) that provides mechanical stiffness to the underlying package substrate 541 in order to reduce warpage or other deformation of the package substrate 541.

In an embodiment, the package substrate 541 may be coupled to a board 591, such as a PCB. In an embodiment, the package substrate 541 is coupled to the board 591 by interconnects 592. While shown as solder balls, it is to be appreciated that the interconnects 592 may be any suitable interconnect architecture, such as sockets or the like.

In FIG. 5, the package substrate 541 and metal PCB heat spreader 550 are substantially similar to the embodiments shown above in FIG. 1C. However, it is to be appreciated that the electronic system 590 may include any of the metal PCB heat spreaders described in greater detail herein.

Figure 6:
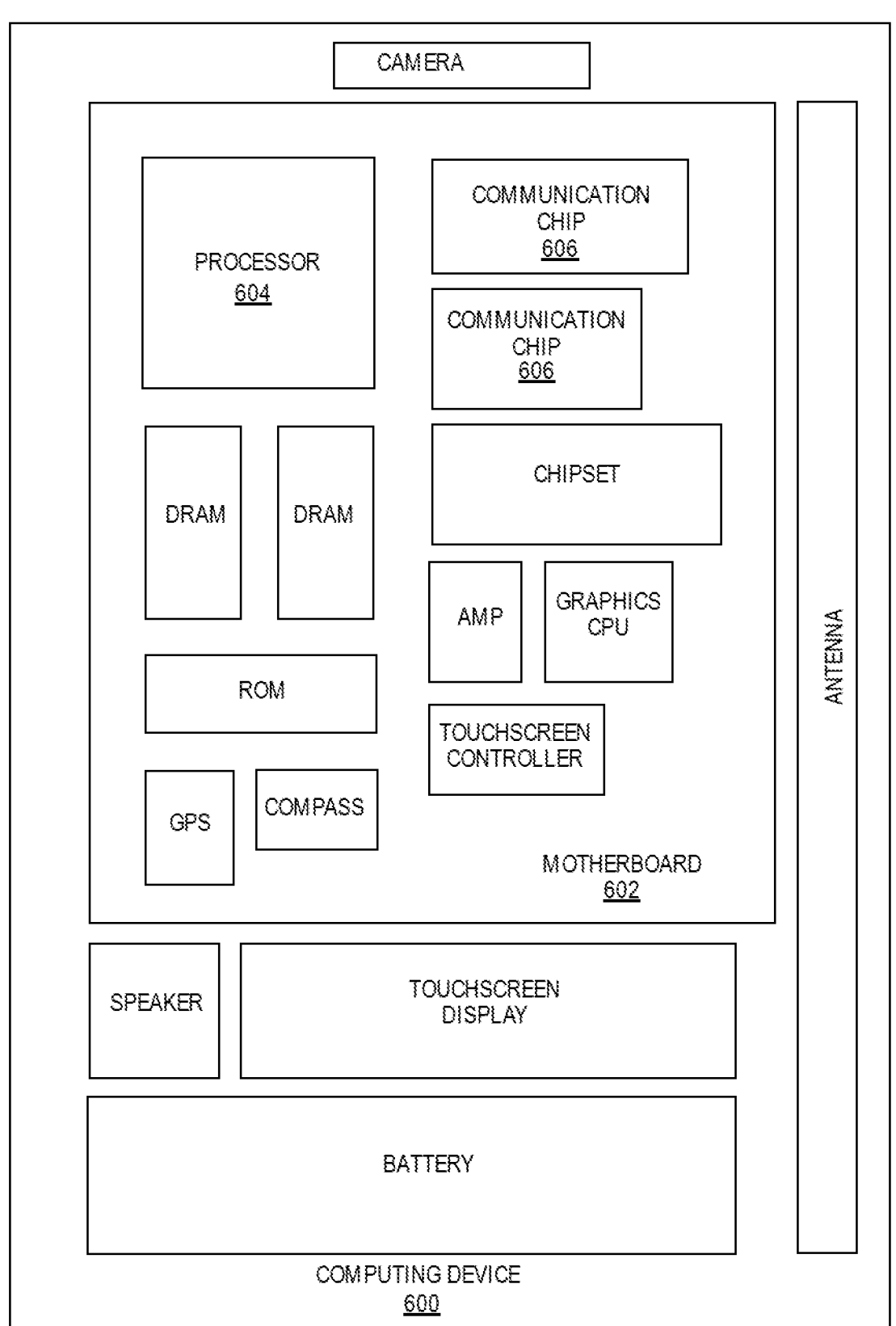
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may part of an electronic package that includes a metal PCB heat spreader that provides top electrical connections, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may part of an electronic package that includes a metal PCB heat spreader that provides top electrical connections, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die on the package substrate; a voltage regulator on the package substrate adjacent to the die; and a metal printed circuit board (PCB) heat spreader, wherein a trace on the metal PCB heat spreader couples the die to the voltage regulator.

Example 2: the electronic package of Example 1, wherein the metal PCB heat spreader comprises a metal core, and wherein a dielectric layer is between the metal core and the trace.

Example 3: the electronic package of Example 2, wherein a thickness of the metal core is approximately 5.0 mm or less.

Example 4: the electronic package of Example 2 or Example 3, wherein the metal core is grounded.

Example 5: the electronic package of Examples 2-4, wherein the metal core comprises copper.

Example 6: the electronic package of Examples 1-5, wherein a footprint of the metal PCB heat spreader is larger than a combined footprint of the die and the voltage regulator.

Example 7: the electronic package of Examples 1-6, wherein the metal PCB heat spreader is coupled to the package substrate by a stiffener.

Example 8: the electronic package of Examples 1-7, wherein the metal PCB heat spreader is coupled to the package substrate by a sealant.

Example 9: the electronic package of Examples 1-8, wherein metal PCB heat spreader comprises legs that are coupled to the package substrate by a sealant.

Example 10: the electronic package of Examples 1-9, further comprising a stiffener surrounding the die.

Example 11: the electronic package of Examples 1-10, further comprising an integrated heat spreader over the PCB heat spreader.

Example 12: the electronic package of Examples 1-11, further comprising a second die between the die and the package substrate.

Example 13: a metal PCB heat spreader, comprising: a metal layer; a dielectric layer over the metal layer; a first trace on a surface of the dielectric layer; and a second trace that pass through the dielectric layer and is coupled to the metal layer.

Example 14: the metal PCB heat spreader of Example 13, wherein the metal layer comprises copper.

Example 15: the metal PCB heat spreader of Example 13 or Example 14, wherein the metal layer has a thickness of approximately 5.0 mm or less.

Example 16: the metal PCB heat spreader of Examples 13-15, further comprising legs that extend down from the metal layer, wherein the legs are coupled to the metal layer.

Example 17: the metal PCB heat spreader of Examples 13-16, wherein the first trace is electrically isolated from the metal layer.

Example 18: a method of forming a metal PCB heat spreader, comprising: providing a metal layer; forming a dielectric layer over the metal layer; patterning the dielectric layer; forming a seed layer over the dielectric layer; forming a patterning layer over the seed layer, wherein first openings are provided over the dielectric layer and second openings are provided over the metal layer; plating the first openings and the second openings to form first traces in the first openings and second traces in the second openings; removing the seed layer; disposing a thermally conductive polymer over the first traces and the second traces; forming openings into the thermally conductive polymer over the first traces and the second traces; and disposing a solder in the openings into the thermally conductive polymer.

Example 19: the method of Example 18, further comprising: a second metal layer attached to the first metal layer by a temporary adhesive, and wherein a second metal PCB heat spreader is formed on the second metal layer.

Example 20: the method of Example 19, further comprising: releasing the temporary adhesive after the metal PCB heat spreader and the second metal PCB heat spreader are formed.

Example 21: the method of Examples 18-20, wherein the first openings are wider than the second openings.

Example 22: the method of Examples 18-21, further comprising: forming a surface finish over the first traces and the second traces before the solder is disposed into the openings.

Example 23: an electronic system, comprising: a board; a package substrate coupled to the board; a first die on the package substrate; a second die on the package substrate; a voltage regulator on the package substrate between the first die and the second die; and a metal printed circuit board (PCB) heat spreader, wherein a first trace on the metal PCB heat spreader couples the first die to the voltage regulator and a second trace on the metal PCB heat spreader couples the second die to the voltage regulator.

Example 24: the electronic system of Example 23, wherein the metal PCB heat spreader comprises a metal core, and wherein a dielectric layer is between the metal core and the first trace and the second trace.

Example 25: the electronic package of Example 24, wherein a thickness of the metal core is approximately 5.0 mm or less.

What is claimed is:

1. An electronic package, comprising:
a package substrate;
a die on the package substrate;
a voltage regulator on the package substrate, the voltage regulator laterally spaced apart from the die; and
a metal printed circuit board (PCB) heat spreader, wherein a trace on the metal PCB heat spreader couples the die to the voltage regulator.

2. The electronic package of claim 1, wherein the metal PCB heat spreader comprises a metal core, and wherein a dielectric layer is between the metal core and the trace.

3. The electronic package of claim 2, wherein a thickness of the metal core is approximately 5.0 mm or less.

4. The electronic package of claim 2, wherein the metal core is grounded.

5. The electronic package of claim 2, wherein the metal core comprises copper.

6. The electronic package of claim 1, wherein a footprint of the metal PCB heat spreader is larger than a combined footprint of the die and the voltage regulator.

7. The electronic package of claim 1, wherein the metal PCB heat spreader is coupled to the package substrate by a stiffener.

8. The electronic package of claim 1, wherein the metal PCB heat spreader is coupled to the package substrate by a sealant.

9. The electronic package of claim 1, wherein metal PCB heat spreader comprises legs that are coupled to the package substrate by a sealant.

10. The electronic package of claim 1, further comprising a stiffener surrounding the die.

11. The electronic package of claim 1, further comprising an integrated heat spreader over the PCB heat spreader.

12. The electronic package of claim 1, further comprising a second die between the die and the package substrate.

13. A metal PCB heat spreader, comprising:
a metal layer;
a dielectric layer over the metal layer;
a first trace on a surface of the dielectric layer; and
a second trace that passes through the dielectric layer and is coupled to the metal layer, the second trace and the first trace configured to couple a die and a voltage regulator, the die laterally spaced apart from the voltage regulator.

14. The metal PCB heat spreader of claim 13, wherein the metal layer comprises copper.

15. The metal PCB heat spreader of claim 13, wherein the metal layer has a thickness of approximately 5.0 mm or less.

16. The metal PCB heat spreader of claim 13, further comprising legs that extend down from the metal layer, wherein the legs are coupled to the metal layer.

17. The metal PCB heat spreader of claim 13, wherein the first trace is electrically isolated from the metal layer.

18. An electronic system, comprising:
a board;
a package substrate coupled to the board;
a first die on the package substrate;
a second die on the package substrate;
a voltage regulator on the package substrate between and laterally spaced apart from the first die and the second die; and
a metal printed circuit board (PCB) heat spreader, wherein a first trace on the metal PCB heat spreader couples the first die to the voltage regulator and a second trace on the metal PCB heat spreader couples the second die to the voltage regulator.

19. The electronic system of claim 18, wherein the metal PCB heat spreader comprises a metal core, and wherein a dielectric layer is between the metal core and the first trace and the second trace.

20. The electronic package of claim 19, wherein a thickness of the metal core is approximately 5.0 mm or less.

* * * * *